(12) United States Patent
Lee

(10) Patent No.: US 7,616,030 B2
(45) Date of Patent: Nov. 10, 2009

(54) SEMICONDUCTOR DEVICE AND OPERATION METHOD THEREOF

(75) Inventor: Sang-Hee Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/157,240

(22) Filed: Jun. 9, 2008

(65) Prior Publication Data

US 2009/0121768 A1    May 14, 2009

(30) Foreign Application Priority Data

Nov. 9, 2007    (KR) .................... 10-2007-0114253

(51) Int. Cl.
  *H03L 7/00*    (2006.01)
(52) U.S. Cl. .................... 327/141; 327/161; 375/357
(58) Field of Classification Search ................ 327/141, 327/161; 375/357, 373
  See application file for complete search history.

(56) References Cited

U.S. PATENT DOCUMENTS 4,011,465 A * 3/1977 Alvarez, Jr. ................ 327/141
4,914,325 A * 4/1990 Yamada ..................... 327/144

FOREIGN PATENT DOCUMENTS

KR    10-0286099 B1    1/2001
KR    10-0668499 B1    1/2007

* cited by examiner

*Primary Examiner*—Kenneth B. Wells
(74) *Attorney, Agent, or Firm*—Blakely Sokoloff Taylor & Zafman

(57) ABSTRACT

Semiconductor device and operation method thereof includes an aspect of the present invention, there is provided a clock generator configured to receive an external clock signal to generate a first clock signal corresponding to a rising edge of the external clock and a second clock signal corresponding to a falling edge of the external clock, a drive control signal generator configured to restrict an activation period of the first clock signal within a deactivation period of the second clock signal to generate a first drive control signal, and restrict an activation period of the second clock signal within a deactivation period of the first clock signal to generate a second drive control signal and an output driver configured to receive a drive data in response to the first and second drive control signal to drive an output terminal in response to the drive data.

25 Claims, 4 Drawing Sheets

SEMICONDUCTOR DEVICE AND OPERATION METHOD THEREOF

CROSS-REFERENCE TO RELATED APPLICATIONS

The present invention claims priority of Korean patent application number 10-2007-0114253, filed on Nov. 09, 2007, which is incorporated by reference in its entirety.

BACKGROUND OF THE INVENTION

The present invention relates to a semiconductor device, and more particularly, to a semiconductor device that secures a data valid window of a data output in synchronization with a clock signal, and an operation method of the semiconductor device.

A semiconductor device such as a double data rate synchronous DRAM (DDR SDRAM) receives an external clock signal to generate an internal clock signal. Between the external clock signal and the internal clock signal, clock skew may occur due to delay in the semiconductor device. Accordingly, the semiconductor device includes a clock synchronization circuit for compensating it, such as a phase locked loop (PLL) and a delay locked loop (DLL).

This internal clock signal is input into various circuits in the semiconductor device to serve as a reference.

FIG. 1 is a circuit diagram of a typical semiconductor device.

Referring to FIG. 1, the typical semiconductor device includes a DLL 110, a pulse generator 130, a pre-driver 150 and a main driver 170.

The DLL 110 compensates clock skew of an external clock signal CLK_EXT to generate a rising DLL clock signal RCLK_DLL and a falling DLL clock signal FCLK_DLL. The rising DLL clock signal RCLK_DLL corresponds to a rising edge of the external clock CLK_EXT, and the falling DLL clock signal FCLK_DLL corresponds to a falling edge of the external clock CLK_EXT.

The pulse generator 130 receives the rising DLL clock signal RCLK_DLL and the falling DLL clock signal FCLK_DLL to output a first drive control signal CTR_PDR1 and a second drive control signal CTR_PDR2 as pulse signals. In more detail, the pulse generator 130 includes a first pulse generator 132 and a second pulse generator 134. The first pulse generator 132 controls a pulse width of the rising DLL clock signal RCLK_DLL to generate the first drive control signal CTR_PDR1. The second pulse generator 134 controls a pulse width of the falling DLL clock signal FCLK_DLL to generate the second drive control signal CTR_ PDR2.

The pre-driver 150 receives a first data DAT1 in response to the first drive control signal CTR_PDR1 and a second data DAT2 in response to the second control signal CTR_PDR2 to latch and output them. The main driver 170 drives an output terminal DQ in response to the first and second data DAT1 and DAT2 received from the pre-driver 150.

In more detail, the pre-driver 150 includes a first pre-driver 152 and a second pre-driver 154. Each of the first and second pre-drivers 152 and 154 receives the first data DAT1 in response to the first drive control signal CTR_PDR1 and the second data DAT2 in response to the second drive control signal CTR_PDR2 to latch and output them. The main driver 170 includes a pull-up driver 172 and a pull-down driver 174. The pull-up driver 172 pulls up the output terminal DQ in response to an output signal of the first pre-driver 172. The pull-down driver 174 pulls down the output terminal DQ in response to an output signal of the second pre-driver 174.

A simple exemplary operation of the typical semiconductor device of FIG. 1 will be described below. The DLL 110 generates the rising DLL clock signal RCLK_DLL and the falling DLL clock signal FCLK_DLL. The first pulse generator 132 receives the rising DLL clock signal RCLK_DLL to generate the first drive control signal CTR_PDR1, and the second pulse generator 134 receives the falling DLL clock signal FCLK_DLL to generate the second drive control signal CTR_PDR2. Here, the first and second pulse generators 132 and 134 control pulse widths of the first drive control signal CTR_PDR1 and the second drive control signal CTR_PDR2, respectively. As such, it is possible to prevent overlapping of activation periods of the first and second drive control signals CTR_PDR1 and CTR_PDR2.

Accordingly, interference of the first and second data DAT1 and DAT2 can also be prevented while they are input to each of the first and second pre-drivers 152 and 154 in response to the first and second drive control signals CTR_PDR1 and CTR_PDR2.

The main driver 170 pulls up or down the output terminal DQ in response to the first data DAT1 received from the first and second pre-drivers 152 and 154. Thereafter, the main drier 170 pulls up or down the output terminal DQ in response to the second data DAT2 input from the first and second pre-drivers 152 and 154.

However, as operation frequency of a semiconductor device increases, the first and second clock generators 132 and 134 may operate abnormally. Consequently, the activation periods of the first and second drive control signals CTR_PDR1 and CTR_PDR2 may overlap each other. This may be caused by variations of process, voltage and temperature (PVT), distortions of the rising and falling DLL clock signals RCLK_DLL and FCLK_DLL, and loading difference between transfer lines of the rising DLL clock signal RCLK_DLL and the falling DLL clock signal FCLK_DLL.

In the case where the activation periods of the first drive control signal CTR_PDR1 and the second drive control signal CTR_PDR2 overlap each other, a first transfer gate TG1 and a second transfer gate TG2 of the first pre-driver 152 may turn on simultaneously. Therefore, the first and second data DAT1 and DAT2 may input to the first pre-driver 152 simultaneously, which may result in interference of the first and second data DAT1 and DAT2. This is the same in the case of the second pre-driver 154.

If the first and second data DAT1 and DAT2 have different logic levels from each other, for example, if the first data DAT1 has a logic high level and the second data DAT2 has a logic low level, in a duration where the activation periods of the first and second drive control signals CTR_PDR1 and CTR_PDR2 overlap each other, the first and second data DAT1 and DAT2 interfere with each other. Then, the main driver 170 cannot secure stable operation timings for a pull-up operation and a pull-down operation.

Consequently, a data valid window of data output from the output terminal DQ may become irregular, and thus duty ratio may be distorted. This means that the semiconductor device cannot output data of a stable voltage level at a desired timing. In addition, interference of the first and second data DAT1 and DAT2 may generate an unwanted current path, thereby increasing unnecessary current consumption.

SUMMARY OF THE INVENTION

Embodiments of the present invention are directed to providing a semiconductor device that can prevent overlapping of activation periods of first and second drive control signals and thus can prevent interference of output data, and operation method of the semiconductor device.

In accordance with an aspect of the present invention, there is provided a clock generator configured to receive an external clock signal to generate a first clock signal corresponding to a rising edge of the external clock and a second clock signal corresponding to a falling edge of the external clock, a drive control signal generator configured to restrict an activation period of the first clock signal within a deactivation period of the second clock signal to generate a first drive control signal, and restrict an activation period of the second clock signal within a deactivation period of the first clock signal to generate a second drive control signal and an output driver configured to receive a drive data in response to the first and second drive control signal to drive an output terminal in response to the drive data. In accordance with another aspect of the present invention, there is provided an operation method of a semiconductor device, the operation method includes a step of receiving an external clock signal to generate a first clock signal corresponding to a rising edge of the external clock signal and a second clock signal corresponding to a falling edge of the external clock signal, a step of restricting an activation period of the first clock signal within a deactivation period of the second clock signal to generate a first drive control signal, a step of restricting an activation period of the second clock signal within a deactivation period of the first clock signal to generate a second drive control signal and receiving a drive data in response to the first and second drive control signals to drive an output terminal in response to the drive data.

DESCRIPTION OF SPECIFIC EMBODIMENTS

Hereinafter, a semiconductor device and an operation method of the semiconductor device in accordance with the present invention will be described in detail with reference to the accompanying drawings.

Figure 1:
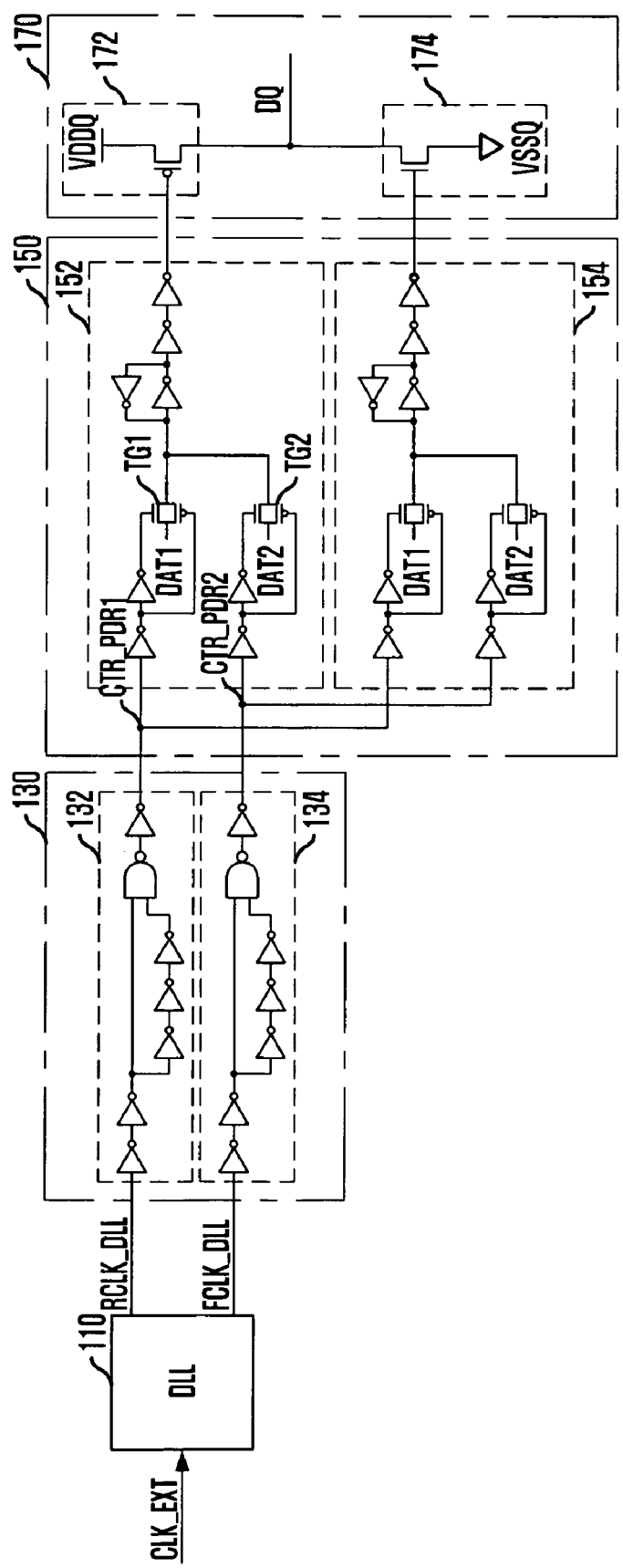
FIG. 1 is a circuit diagram of a typical semiconductor device.
Figure 2:
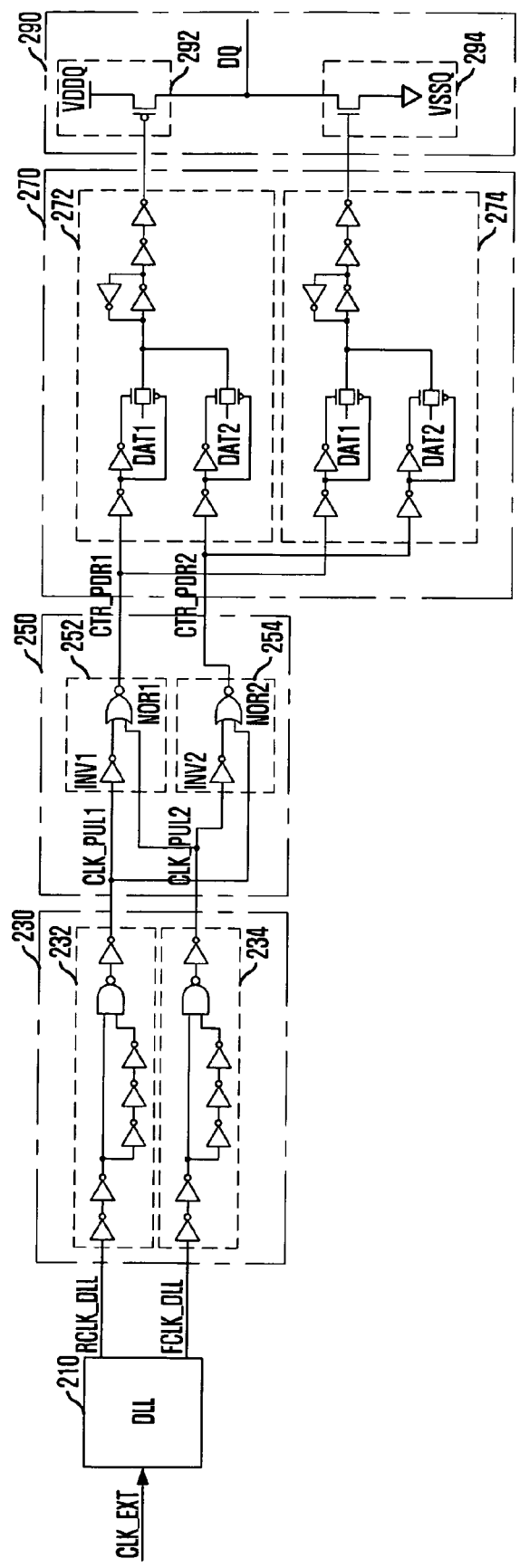
FIG. 2 is a circuit diagram of a semiconductor device in accordance with an embodiment of the present invention.

FIG. 2 is a circuit diagram of a semiconductor device in accordance with an embodiment of the present invention.

Referring to FIG. 2, the semiconductor device includes a DLL 210, a pulse generator 230, a drive control signal generator 250, a pre-driver 270 and a main driver 290.

The DLL 210, a clock synchronization circuit, compensates clock skew of an external clock signal CLK_EXT to generate a rising DLL clock signal RCLK_DLL and a falling DLL clock signal FCLK_DLL. The rising DLL clock signal RCLK_DLL corresponds to a rising edge of the external clock signal CLK_EXT and the falling DLL clock signal FCLK_DLL corresponds to a falling edge of the external clock signal CLK_EXT. The rising and falling DLL clock signals RCLK_DLL and FCLK_DLL serve as source clocks in the pulse generator 230.

The pulse generator 230 receives the rising and falling DLL clock signals RCLK_DLL and FCLK_DLL to generate a first clock signal CLK_PUL1 and a second clock signal CLK_PUL2 as pulse signals, respectively. In more detail, the pulse generator 230 includes a first pulse generator 232 and a second pulse generator 234. The first pulse generator 232 controls pulse width of the rising DLL clock signal RCLK_DLL to generate the first clock signal CLK_PUL1. The second pulse generator 234 controls pulse width of the falling DLL clock signal FCLK_DLL to generate the second clock signal CLK_PUL2. As operation frequency increases, the pulse generator 230 may operate abnormally, similar to that of the typical semiconductor device.

Therefore, the semiconductor device in accordance with the embodiment further includes a drive control signal generator 250. The drive control signal generator 250 receives the first and second clock signals CLK_PUL1 and CLK_PUL2 to generate a first drive control signal CTR_PDR1 and a second drive control signal CTR_PDR2. As such, it is possible to prevent overlapping of activation periods of the first and second drive control signals CTR_PDR1 and CTR_PDR2.

The first and second drive control signals CTR_PDR1 and CTR_PDR2 have different activation periods from each other. To this end, the drive control signal generator 250 may include a first drive control signal generator 252 and a second drive control signal generator 254. The first drive control signal generator 252 restricts an activation period of the first clock signal CLK_PUL1 within a deactivation period of the second clock signal CLK_PUL2, to generate the first drive control signal CTR_PDR1. The second drive control signal generator 254 restricts an activation period of the second clock signal CLK_PUL2 within a deactivation period of the first clock signal CLK_PUL1, to generate the second drive control signal CTR_PDR2.

The first drive control signal generator 252 may include a first inverter INV1 and a first NOR gate NOR1. The first inverter INV1 inverts the first clock signal CLK_PUL1. The first NOR gate NOR1 outputs the first drive control signal CTR_PDR1 according to the second clock signal CLK_PUL2 and an output signal of the first inverter INV1. Similarly, the second drive control signal generator 254 may include a second inverter INV2 and a second NOR gate NOR2. The second inverter INV2 inverts the second clock signal CLK_PUL2. The second NOR gate NOR2 outputs the second drive control signal CTR_PDR2 according to the first clock signal CLK_PUL1 and an output signal of the second inverter INV2.

The pre-driver 270 receives a first data DAT1 in response to the first drive control signal CTR_PDR1 and a second data DAT2 in response to the second drive control signal CTR_PDR2 to latch and output them. The main driver 290 drives an output terminal DQ in response to the first data DAT1 and the second data DAT2 which is received from the pre-driver 270.

In more detail, the pre-driver 270 includes a first pre-driver 272 and a second pre-driver 274. The first pre-driver 272 and the second pre-driver 274, each receives the first data DAT1 in response to the first driver control signal CTR_PDR1 and the second data DAT2 in response to the second driver control signal CTR_PDR2, to latch and output them. The main driver 290 includes a pull-up driver 292 and a pull-down driver 294. The pull-up driver 292 pulls up the output terminal DQ in response to an output signal of the first pre-driver 272. The pull-down driver 294 pulls down the output terminal DQ in response to an output signal of the second pre-driver 274.

A simple exemplary operation of the semiconductor device of FIG. 2 will be described below. The DLL 210 generates a rising DLL clock signal RCLK_DLL and a falling DLL clock signal FCLK_DLL. The first pulse generator 232 receives the rising DLL clock signal RCLK_DLL to generate the first clock signal CLK_PUL1, and the second pulse generator 234 receives the falling DLL clock signal FCLK_DLL to generate the second clock signal CLK_PUL2. Here, an activation period of the first clock signal CLK_PUL1 and that of the second clock signal CLK_PUL2 may overlap each other.

Then, the first driver control signal generator 252 receives the second clock signal CLK_PUL2 and an inverted signal of the first clock signal CLK_PUL1 to generate the first drive control signal CTR_PDR1. Similarly, the second drive control signal generator 254 receives the first clock signal CLK_PUL1 and an inverted signal of the second clock signal CLK_PUL2 to generate the second drive control signal CTR_PDR2.

Figure 3:
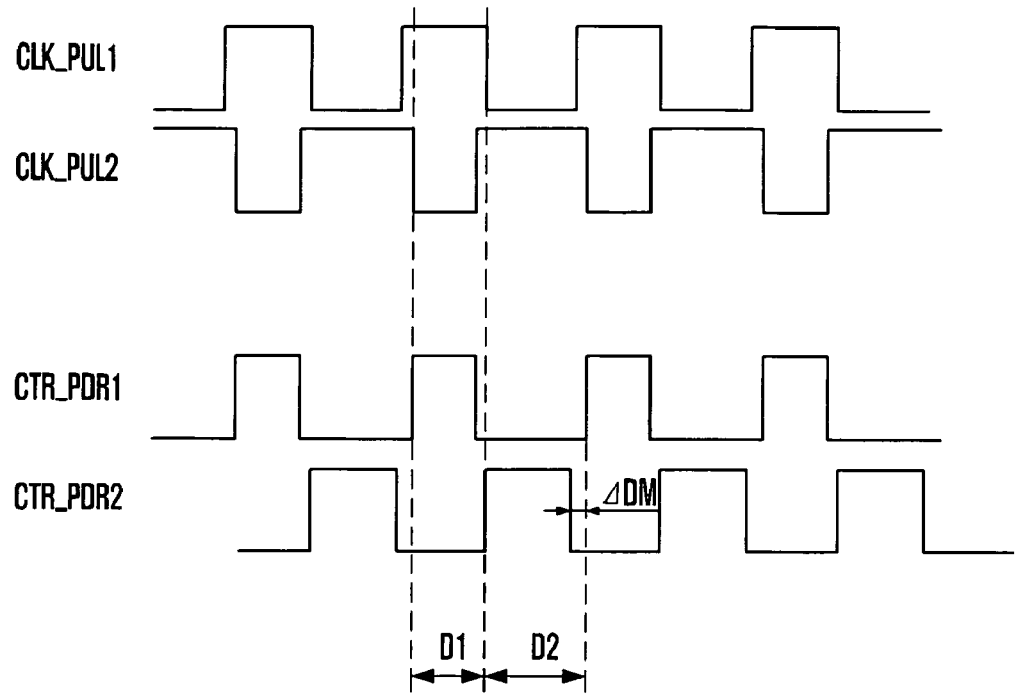
FIG. 3 is a timing diagram of first and second clock signals, and first and second drive control signals of FIG. 2.

FIG. 3 is a timing diagram of the first and second clock signals CLK_PUL1 and CLK_PUL2, and the first and second drive control signals CTR_PDR1 and CTR_PDR2 of FIG. 2.

Referring to FIG. 3, the activation periods of the first and second clock signals CLK_PUL1 and CLK_PUL2 overlap each other. That is, high level periods of the first and second clock signals CLK_PUL1 and CLK_PUL2 overlap each other. This may be caused by an abnormal operation of the first and second pulse generators 232 and 234 as operation frequency of the semiconductor device increases. This may also be caused by PVT variations, distortions of the rising and falling DLL clock signals RCLK_DLL and FCLK_DLL, and loading difference between a transfer line of the rising DLL clock signal RCLK_DLL and that of the falling DLL clock signal FCLK_DLL.

Meanwhile, activation timing of the first drive control signal CTR_PDR1 is determined by whichever of the second clock signal CLK_PUL2 and the inverted signal of the first clock signal CLK_PUL1 that has the later phase. That is, the first drive control signal CTR_PDR1 is activated when both the second clock signal CLK_PUL2 and the inverted signal of the first clock signal CLK_PUL1 have a logic low level. Deactivation timing of the first drive control signal CTR_PDR1 is determined by whichever of the second clock signal CLK_PUL2 and the inverted signal of the first clock signal CLK_PUL1 that has the earlier phase. That is, the first drive control signal CTR_PDR1 is deactivated when any one of the second clock signal CLK_PUL2 and the inverted signal of the first clock signal CLK_PUL1 has a logic high level.

Activation timing of the second drive control signal CTR_PDR2 is determined by whichever of the first clock signal CLK_PUL1 and the inverted signal of the second clock signal CLK_PUL2 that has the later phase. That is, the second drive control signal CTR_PDR2 is activated when both the first clock signal CLK_PUL1 and the inverted signal of the second clock signal CLK_PUL2 have a logic low level. Deactivation timing of the second drive control signal CTR_PDR2 is determined by whichever of the first clock signal CLK_PUL1 and the inverted signal of the second clock signal CLK_PUL2 that has the earlier phase. That is, the second drive control signal CTR_PDR2 is deactivated when any one of the first clock signal CLK_PUL1 and the inverted signal of the second clock signal CLK_PUL2 has a logic high level.

Consequently, activation periods of the first and second drive control signals CTR_PDR1 and CTR_PDR2 do not overlap each other, as shown in FIG. 3.

Referring again to FIG. 2, since the first drive control signal CTR_PDR1 and the second drive control signal CTR_PDR2 have different activation periods from each other, the first data DAT1 and the second data DAT2 do not interfere each other in the first and second pre-drivers 272 and 274. Accordingly, it is possible to prevent generation of an unnecessary current path due to the interference of the first and second data DAT1 and DAT2.

Therefore, the main driver 290 can pull up or down the output terminal DQ in response to the first data DAT1 without interference of the second data DAT2. Likewise, the main driver 290 can pull up or down the output terminal DQ in response to the second data DAT2 without interference of the first data DAT1. In other words, the pull-up and pull-down operations of the main driver 290 in response to the first data DAT1 and the pull-up and pull-down operations of the main driver 290 in response to the second data DAT2 can be performed independently of each other.

Referring again to FIGS. 2 and 3, the drive control signal generator 250 controls pulse widths of the first and second clock signals CLK_PUL1 and CLK_PUL2 such that the activation periods of the first and second drive control signals CTR_PDR1 and CTR_PDR2 do not overlap each other. As such, an additional timing of ΔDM can be secured between the activation periods of the first and second drive control signals CTR_PDR1 and CTR_PDR2.

Therefore, the first drive control signal CTR_PDR1 or the second drive control signal CTR_PDR2 may be delayed further by ΔDM according to circumstances.

In other words, the pre-driver 270 latches the first data DAT1 when the first drive control signal CTR_PDR1 is activated, and the main driver 290 pulls up and down the output terminal DQ in response to the first data DAT1 output from the pre-driver 270. Thereafter, the pre-driver 270 latches the second data DAT2 when the first drive control signal CTR_PDR1 is deactivated and the second drive control signal CTR_PDR2 is activated. The main driver 290 pulls up and down the output terminal DQ in response to the second data DAT2 output from the pre-driver 270.

Accordingly, if a duration D1 for operating the main driver 290 in response to the first data DAT1 is shorter than a duration D2 for operating the main driver 290 in response to the second data DAT2, the second drive control signal CTR_PDR2 can be delayed with a margin of ΔDM, as shown in FIG. 3. This means that it is possible to control the duration D1 for operating the main driver 290 in response to the first data DAT1 and the duration D2 for operating the main driver 290 in response to the second data DAT2 such that the durations D1 and D2 are nearly the same. Furthermore, it is also possible to secure a stable data valid window of the data output to the output terminal DQ, and at the same time, control a duty ratio of the data to 50:50.

Figure 4:
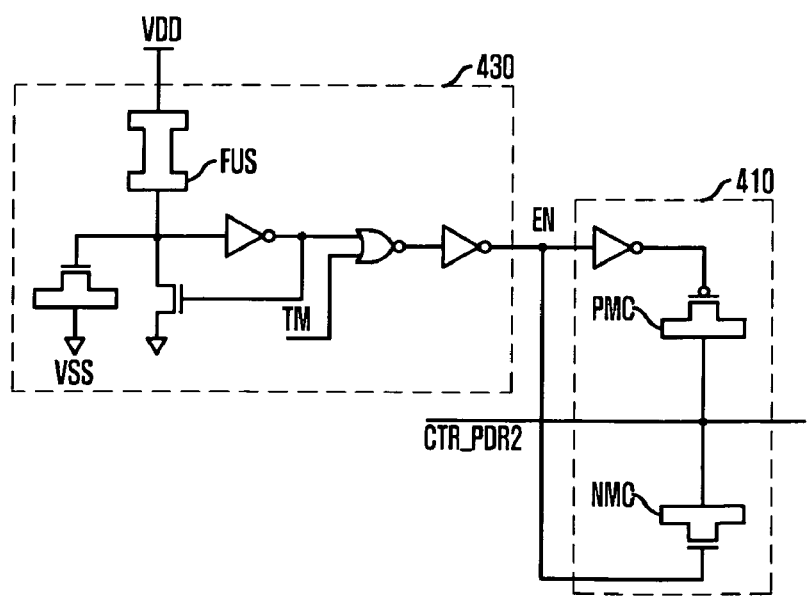
FIG. 4 is a circuit diagram of a circuit for delaying the second drive control signal of FIG. 3 by a predetermined delay time.

FIG. 4 is a circuit diagram of a delay circuit for delaying the second drive control signal CTR_PDR2 of FIG. 3 by a predetermined delay time. Referring to FIG. 4, the delay circuit includes a signal delay 410 and an activation signal generator 430. The activation signal generator 430 generates an activation signal EN. The signal delay 410 delays the second drive control signal CTR_PDR2 by the predetermined delay time in response to the activation signal EN.

The signal delay 410 may include a PMOS capacitor PMC and an NMOS capacitor NMC operating in response to the activation signal EN. The second drive control signal CTR_PDR2 can be delayed by a predetermined delay time of at most ΔDM by the PMOS capacitor PMC and the NMOS capacitor NMC.

Although the signal delay 410 is described to include the PMOS capacitor PMC and the NMOS capacitor NMC that operate in response to the activation signal EN, the present invention is not limited thereto. For example, the signal delay 410 may include a delay device such as a capacitor, a resistor and an inverter, instead. Furthermore, the signal delay 410 may also include a plurality of delay devices to delay the second drive control signal CTR_PDR2 step by step. Since their configurations are obvious to those skilled in the art, a detailed description thereof will be omitted herein.

The activation signal generator 430 generates an activation signal EN according to a test signal TM activated in a test mode or a signal corresponding to a programming state of a fuse FUS. For example, when the test signal has a logic low level and the fuse FUS is not cut, the activation signal EN is deactivated to a logic low level. Then, the signal delay 410 does not operate, and thus the second drive control signal CTR_PDR2 is not delayed. When the test signal has a logic high level or the fuse FUS is cut, the activation signal EN is activated to a logic high level. Then, the signal delay 410 operates to delay the second drive control signal CTR_PDR2.

Figure 5:
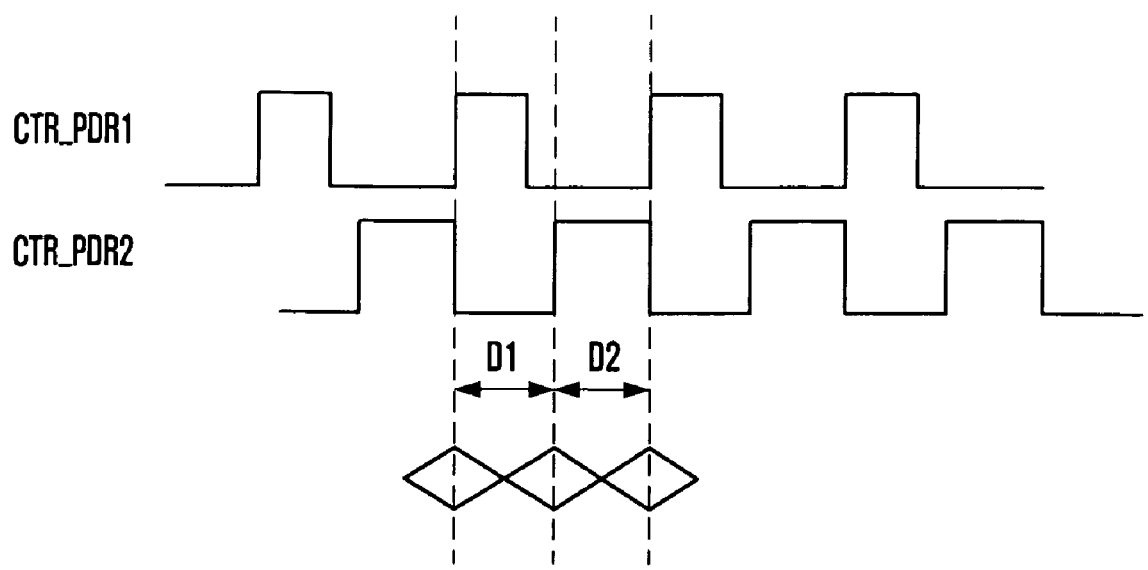
FIG. 5 is a timing diagram of the second drive control signal of FIG. 4 delayed by a predetermined delay time.

FIG. 5 is a timing diagram of the second drive control signal CTR_PDR2 of FIG. 4 delayed by a predetermined delay time of at most ΔDM at the signal delay 410.

Referring to FIG. 5, the second drive control signal CTR_PDR2 is delayed by the predetermined time of at most ΔDM. Comparing with FIG. 3, the duration D1 is nearly the same as the duration D2 in FIG. 5. This means that the data DAT output to the output terminal DQ can have a more stable data valid window, and the duty ratio of the data DAT can be controlled to 50:50.

Preferably, the delay time of the second drive control signal CTR_PDR2 can be controlled such that the high level of the second drive control signal CTR_PDR2 and the high level of the first drive control signal CTR_PDR1 do not overlap each other.

As described above, the first drive control signal CTR_PDR1 and the second drive control signal CTR_PDR2 have different activation periods from each other. As such, the main driver 290 can pull up and down the output terminal DQ in response to the first data DAT1 without interference of the second data DAT2. Likewise, the main driver 290 can pull up and down the output terminal DQ in response to the second data DAT2 without interference of the first data DAT1. Consequently, the data output from the output terminal DQ can have a stable data valid window.

In addition, unnecessary current consumption caused by the interference of the first and second data DAT1 and DAT2 can be minimized.

Furthermore, the duration D1 for operating the main driver 290 in response to the first data DAT1 and the duration D2 for operating the main driver 290 in response to the second data DAT2 can be controlled to be the same. Therefore, the duty ratio of the data output from the output terminal DQ can be controlled to 50:50.

In accordance with embodiments of the present invention, it is possible to prevent overlapping of the activation periods of the first and second drive control signals, and thus interference of the first and second data. Consequently, unnecessary current consumption due to the interference of the first and second data can be minimized.

In addition, more stable data valid window can be secured using the obtained additional margin.

While the present invention has been described with respect to the specific embodiments, it will be apparent to those skilled in the art that various changes and modifications may be made without departing from the spirit and scope of the invention as defined in the following claims.

For example, the location and kind of the logic gate and transistor described in the embodiments may be changed according to a polarity of the input signal.

Furthermore, although the case where the second drive control signal CLK_PDR2 is delayed is described above, the present invention can also be applied to a case where the first drive control signal CTR_PDR1 is delayed.

What is claimed is:

1. A semiconductor device, comprising:
   a clock generator configured to receive an external clock signal to generate a first clock signal corresponding to a rising edge of the external clock signal and a second clock signal corresponding to a falling edge of the external clock signal;
   a drive control signal generator configured to restrict an activation period of the first clock signal within a deactivation period of the second clock signal to generate a first drive control signal, and restrict an activation period of the second clock signal within a deactivation period of the first clock signal to generate a second drive control signal; and
   an output driver configured to receive a drive data in response to the first and second drive control signals to drive an output terminal in response to the drive data.

2. The semiconductor device as recited in claim 1, further comprising a signal delay configured to delay one of the first and second drive control signals by a predetermined delay time in response to an activation signal.

3. The semiconductor device as recited in claim 1, wherein the drive control signal generator comprises:
   a first drive control signal generator configured to generate the first drive control signal according to the first and second clock signals; and
   a second drive control signal generator configured to generate the second drive control signal according to the first and second clock signals.

4. The semiconductor device as recited in claim 1, wherein the first drive control signal and the second drive control signal have different activation periods from each other.

5. The semiconductor device as recited in claim 3, wherein the first drive control signal generator comprises:
   a first signal inversion unit configured to invert the first clock signal; and
   a first signal output unit configured to receive the second clock signal and an output signal of the first signal inversion unit to generate the first drive control signal.

6. The semiconductor device as recited in claim 5, wherein the first drive control signal is activated by whichever of the second clock signal and the output signal of the first signal inversion unit that has the later phase, and deactivated by whichever of the second clock signal and the output signal of the first signal inversion unit that has the earlier phase.

7. The semiconductor device as recited in claim 3, wherein the second drive control signal generator comprises:
   a second signal inversion unit configured to invert the second clock signal; and
   a second signal output unit configured to receive the first clock signal and an output signal of the second signal inversion unit to generate the second drive control signal.

8. The semiconductor device as recited in claim 7, wherein the second drive control signal is activated by whichever of the first clock signal and the output signal of the second signal inversion unit that has the later phase, and deactivated by whichever of the first clock signal and the output signal of the second signal inversion unit that has the earlier phase.

9. The semiconductor device as recited in claim 2, wherein the activation signal comprises:
   a first activation signal configured to delay the first drive control signal by the predetermined delay time; and
   a second activation signal configured to delay the second drive control signal by the predetermined delay time.

10. The semiconductor device as recited in claim 9, wherein the signal delay comprises:
   a first signal delay configured to delay the first drive control signal by the predetermined delay time in response to the first activation signal; and
   a second signal delay configured to delay the second drive control signal by the predetermined delay time in response to the second activation signal.

11. The semiconductor device as recited in claim 2, further comprising an activation signal generator configured to generate the activation signal corresponding to a programming state of one of a fuse and a test mode.

12. The semiconductor device as recited in claim 1, wherein the clock generator comprises:
   a clock synchronizer configured to generate a source clock signal synchronized with the external clock signal; and
   a pulse generator configured to receive the source clock signal to generate the first and second clock signals as pulse signals.

13. The semiconductor device as recited in claim 1, wherein the output driver comprises:
   a pre-driver configured to latch the drive data in response to the first and second drive control signals; and
   a main driver configured to drive the output terminal in response to the drive data output from the pre-driver.

14. An operation method of a semiconductor device, the operation method comprising:
   receiving an external clock signal to generate a first clock signal corresponding to a rising edge of the external clock signal and a second clock signal corresponding to a falling edge of the external clock signal;
   restricting an activation period of the first clock signal within a deactivation period of the second clock signal to generate a first drive control signal;
   restricting an activation period of the second clock signal within a deactivation period of the first clock signal to generate a second drive control signal; and
   receiving a drive data in response to the first and second drive control signals to drive an output terminal in response to the drive data.

15. The operation method as recited in claim 14, further comprising delaying one of the first and second drive control signals by a predetermined delay time in response to an activation signal.

16. The operation method as recited in claim 14, wherein the first drive control signal and the second drive control signal have different activation periods from each other.

17. The operation method as recited in claim 14, wherein the restricting of the activation period of the first clock signal comprises:
   inverting the first clock signal; and
   receiving the second clock signal and the inverted first clock signal to generate the first drive control signal.

18. The operation method as recited in claim 14, wherein the first drive control signal is activated by whichever of the second clock signal and the inverted first clock signal that has the later phase, and deactivated by whichever of the second clock signal and the inverted first clock signal that has the earlier phase.

19. The operation method as recited in claim 14, wherein the restricting of the activation period of the second clock signal comprises:
   inverting the second clock signal; and
   receiving the first clock signal and the inverted second clock signal to generate the second drive control signal.

20. The operation method as recited in claim 19, wherein the second drive control signal is activated by whichever of the first clock signal and the inverted second clock signal that has the later phase, and deactivated by whichever of the first clock signal and the inverted second clock signal that has the earlier phase.

21. The operation method as recited in claim 15, wherein the activation signal comprises:
   a first activation signal configured to delay the first drive control signal by the predetermined delay time; and
   a second activation signal configured to delay the second drive control signal by the predetermined delay time.

22. The operation method as recited in claim 21, wherein the delaying of the one of the first and second drive control signals comprises:
   delaying the first drive control signal by the predetermined delay time in response to the first activation signal; and
   delaying the second drive control signal by the predetermined delay time in response to the second activation signal.

23. The operation method as recited in claim 15, further comprising generating the activation signal corresponding to a programming state of one of a fuse and a test mode.

24. The operation method as recited in claim 14, wherein the receiving of the external clock signal comprises:
   generating a source clock signal synchronized with the external clock signal; and
   receiving the source clock signal to generate the first and second clock signals as pulse signals.

25. The operation method as recited in claim 14, wherein the receiving of the drive data comprises:
   latching the drive data in response to the first and second drive control signals; and
   outputting the latched drive data.

* * * * *